United States Patent
Maxwell et al.

(10) Patent No.: US 6,946,744 B2
(45) Date of Patent: Sep. 20, 2005

(54) SYSTEM AND METHOD OF REDUCING DIE ATTACH STRESS AND STRAIN

(75) Inventors: John Alan Maxwell, Newbury Park, CA (US); Mysore Purushotham Divakar, San Diego, CA (US); Thomas Henry Templeton, Jr., Fremont, CA (US)

(73) Assignee: Power-One Limited (KY)

( * ) Notice: Subject to any disclaimer, the term of this patent is extended or adjusted under 35 U.S.C. 154(b) by 34 days.

(21) Appl. No.: 10/423,571

(22) Filed: Apr. 24, 2003

(65) Prior Publication Data

US 2004/0212054 A1 Oct. 28, 2004

(51) Int. Cl.$^7$ ............................................. H01L 23/48
(52) U.S. Cl. ........................ 257/782; 257/779; 257/783; 257/784; 257/785; 257/775
(58) Field of Search ................................ 257/779, 782, 257/783, 784, 785, 775, 773

(56) References Cited

U.S. PATENT DOCUMENTS

| | | | |
|---|---|---|---|
| 5,489,749 A | * | 2/1996 | DiStefano et al. ........... 174/261 |
| 5,760,455 A | * | 6/1998 | Hierold et al. ............... 257/415 |
| 5,859,475 A | * | 1/1999 | Freyman et al. ............. 257/738 |
| 6,294,405 B1 | * | 9/2001 | Higgins, III ................. 438/108 |
| 6,624,522 B2 | * | 9/2003 | Standing et al. ............. 257/782 |
| 6,680,436 B2 | * | 1/2004 | Xu et al. ..................... 174/52.2 |

FOREIGN PATENT DOCUMENTS

JP  2000-269269  * 3/1999  ........... H01L/21/60

* cited by examiner

*Primary Examiner*—Jasmine Clark
(74) *Attorney, Agent, or Firm*—O'Melveny & Myers LLP

(57) ABSTRACT

A mounting structure for a semiconductor die that reduces die attach strain within the die attach material without sacrificing the electrical and thermal characteristics of the package. In one embodiment, the mounting structure comprises a die attach metallization layer, a solder mask, and a layer of die attach material. The solder mask forms a solder pattern over the top surface of the die attach metallization layer. The solder pattern covers a portion of the die attach metallization layer to create multiple exposed areas of the die attach metallization layer. Each exposed area is separated by the solder mask and is located under the semiconductor die when the semiconductor die is secured to the mounting structure. A layer of die attach material covers the solder pattern and fills in each one of the exposed areas to form a semiconductor die mounting surface. In another embodiment, the die attach metallization layer is divided into multiple, spaced-apart die attach pads that are electrically coupled together. A layer of die attach material covers a portion of each die attach pad and fills in the space between each die attach pad to form a semiconductor die mounting surface. A method of manufacturing the mounting structure is also disclosed.

39 Claims, 8 Drawing Sheets

SYSTEM AND METHOD OF REDUCING DIE ATTACH STRESS AND STRAIN

FIELD OF THE INVENTION

The present invention generally relates to a semiconductor die mounting structure for a chip package and method of manufacture. More specifically, the present invention relates to a mounting structure that reduces the die attach strain or improves the thermal properties for a given strain that is created between a semiconductor die and a layer of die attach material.

BACKGROUND

A major design problem concerning the production of miniaturized DC—DC converter products is thermal management. More specifically, thermal impedance is a significant design consideration in the selection and design of a package for DC—DC converters. Materials that enable the level of circuit complexity and interconnect necessary to produce a functional package most often result in thermal impedances that make the package inoperable or impractical.

Die attach materials may include solder or adhesives like epoxies, with or without metal fillers like silver particles or flakes. The die attach material properties and geometry represent a significant factor in package resistance and reliability. Strain created in die attach materials is approximately proportional to the square root of the maximum linear dimensions of either the die or die attach area and is also approximately inversely proportional to the square root of die attach material bond line thickness (the thickness of the layer of adhesive material located between the semiconductor die and the package). Thus, to minimize strain in the die attach material, it is desirable to maximize the thickness of the die attach bond lines. However, thicker die attach bond lines result in higher thermal resistances and diminished product performance and reliability.

Efficient heat transfer between the semiconductor die and the die attach pad requires a thin bond material thickness while minimized die attach strain requires a thicker die attach material. The die attach material creates a thermal and electrical path between the semiconductor die and the die attach pad. Thus, increasing the thickness of the die attach material reduces the thermal and electrical performance of the die attach material by increasing the thermal and electrical resistance. Optimizing the heat transfer and strain characteristics of the die attach material present conflicting requirements. These two properties must be balanced in an effort to achieve maximum thermal and mechanical performance of the package.

Other problems associated with attaching large semiconductor dice in packages include poor adhesion of mold materials, such as epoxy Novalac, to metal surfaces and moisture diffusion into the package. Moisture turns to steam during normal reflow soldering operations and can break the bond between the mold material and metallization areas adjacent to or on the die attach area. High pressure steam in this area (exposed die attach pad) acts as a wedge during reflow soldering and can lead to increased moisture sensitivity for reflow solder processing and die attach separation.

Reduction of die attach stress encountered in assembly and end customer processing may be accomplished by controlling both the die attach material bond line thickness and reducing the amount of exposed die attach metallization to the mold material. At the same time, optimum thermal performance of the package is accomplished by controlling the die attach material bond line thickness.

Package mold materials have superior adhesion properties to solder mask materials used on laminate substrates than to exposed metallization like gold flash over nickel plated on copper traces which are commonly found on laminate substrates. Solder mask materials have excellent adhesion to those same metallization schemes. There are various substrate layout techniques for reducing or eliminating die attach metallization exposure to package mold material and controlling die attach material thickness.

FIG. 1 illustrates a technique that eliminates or reduces metallization exposure to package mold material by controlling the size of the solder mask opening. A solder mask 18 is formed over the substrate 12 such that it creates an opening or "window" that is slightly larger (e.g., 0.002 in) than the dimensions of the semiconductor die 10. A layer of die attach adhesive 14 is deposited into the opening and covers the die attach metallization layer 16. The semiconductor die 10 is placed into the solder mask opening and contacts the layer of die attach material 14. Since the solder mask opening is larger than the semiconductor die 10, a gap 20 is created between the edges 10a of the semiconductor die 10 and the edges 18a of the solder mask 18. The layer of die attach material 14 fills the solder mask "window" and the gap 20 when the semiconductor die 10 is pressed into the layer of die attach material 14. Thus, this technique eliminates possible metal exposure of the die attach metallization layer 16 to the mold material 22. The technique also creates a layer of die attach material 14 having a thickness T1 between the semiconductor die 10 and the die attach metallization layer 16. This technique is typically used when thin bond line control is required to maximize the thermal and electrical performance of the package.

FIG. 2 illustrates a technique to increase the die attach bond line material thickness. A semiconductor die 10 is attached to a substrate 12 by a die attach adhesive 14. In this technique, the solder mask 18 creates an opening or "window" that is slightly smaller (e.g., 0.002 in) than the dimensions of the semiconductor die 10. The die attach adhesive 14 is deposited into the solder mask opening and covers the die attach metallization layer 16. The semiconductor die 10 is placed over the solder mask opening and contacts the die attach material 14. The die attach material 14 fills the solder mask "window" when the semiconductor die 10 is pressed onto the die attach material 14. Since the solder mask opening is smaller than the semiconductor die 10, the edges 10a of the semiconductor die 10 slightly overlap the edges 18a of the solder mask 18. Thus, the semiconductor die 10 sits on a solder mask shelf 21 and eliminates possible exposure of the die attach metallization layer 16 to the package mold material 22. This technique creates a thicker layer of die attach adhesive 14, shown as T2 in FIG. 2, than the package shown in FIG. 1.

It would be desirable to reduce the die attach bond line material thickness without sacrificing the strain or stress properties of the package. It would also be desirable to reduce strain without sacrificing the thermal properties of the package.

SUMMARY OF THE INVENTION

One aspect of the present invention is to provide a mounting structure for a semiconductor die that optimizes the electrical and thermal properties of the package. In one embodiment, the mounting structure includes a solder mask that forms a pattern over a portion of the die attach metallization layer. The pattern leaves portions of the die attach metallization layer exposed. The pattern may comprise various shapes including, but not limited to, rectangular and elliptical. A layer of thermally conductive die attach material covers the pattern and fills in the exposed areas of the die attach metallization layer.

Another aspect of the present invention is to provide a mounting structure for a semiconductor die that reduces the die attach strain realized by the layer of die attach material. In one embodiment, the mounting structure is comprised of multiple die attach pads that are electrically coupled together by copper traces or bond wires since each die attach pad is separated from an adjacent die pad. In another embodiment, a solder mask forms a pattern over the die attach metallization layer and creates multiple exposed areas. Each exposed area reduces the linear dimension of the die attach area between the semiconductor die and the die attach metallization layer.

Still another aspect of the present invention is to reduce or eliminate die attach metallization exposure to package mold material. In one embodiment, the layer of die attach material overlaps the mask pattern and the die attach metallization layer so that the package mold material only contacts the solder mask, the layer of die attach material, and the semiconductor die. In another embodiment, the layer of die attach material covers a portion of each die attach pad. The exposed peripheral region of each die attach pad is preferably covered by a solder mask to prevent the package mold material from contacting the die attach pads. A gap between the solder mask and the layer of die attach material may exist—leaving a small portion of each die attach pad exposed to the package mold material.

Yet another aspect of the present invention is to provide a layer of die attach material that optimizes the electrical and thermal properties of the package while minimizing the increase in die attach strain. In one embodiment, the mounting structure provides a layer of die attach material that varies in thickness beneath the semiconductor die. The thin layer of die attach material optimizes the electrical and thermal properties of the package. The thicker layer of die attach material lowers the strain realized by the die attach material.

Still another aspect of the present invention is to reduce the maximum die attach dimensions. In one embodiment, a pattern in the solder mask covers a portion of the die attach metallization layer and leaves multiple areas of the die attach metallization layer exposed. The web located between each exposed area reduces the cross-sectional area of attachment between the semiconductor die and the die attach metallization layer. The width of each web is minimized to prevent a large increase in both the thermal and electrical resistance characteristics of the package.

DETAILED DESCRIPTION OF THE PRESENT INVENTION

Figure 1:
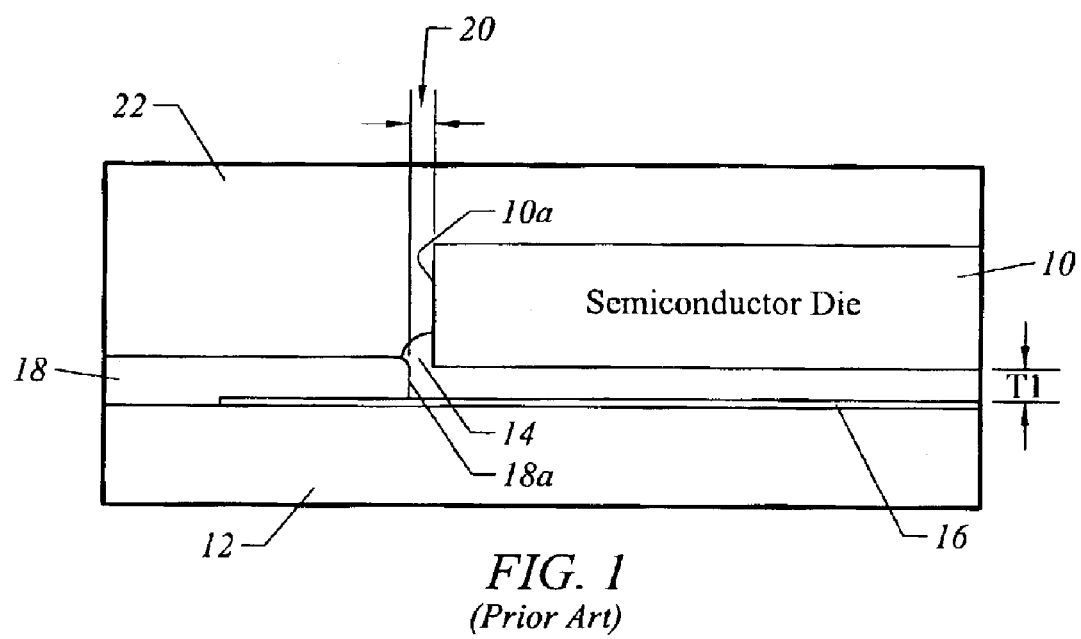
FIG. 1 is a cross-sectional representative view of a semiconductor die attached to a substrate, according to the prior art.
Figure 2:
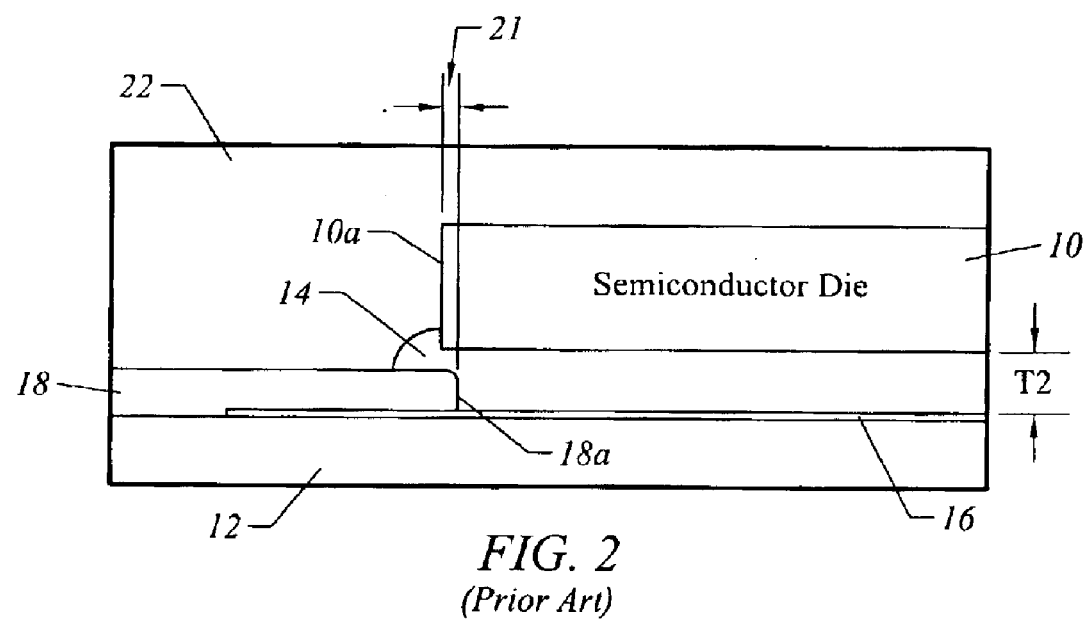
FIG. 2 is a cross-sectional representative view of a semiconductor die attached to a substrate, according to the prior art.

The present invention provides several mounting structures 100 for reducing die attach strain realized by the layer of die attach material the secures the semiconductor die to the package. FIGS. 3–4 illustrate several embodiments of a mounting structure 100. Each mounting structure preferably includes a substrate 112, a die attach metallization layer 116, a layer of die attach material 114, and a solder mask 118. The term "solder mask," as used throughout this application, is used to describe any material and/or structure that provides a protective layer or covering over a substrate. In general, the solder mask 118 forms a pattern that covers a portion of the die attach metallization layer 116 and leaves several areas of the die attach metallization layer 116 exposed.

Several features of the mounting structures 100 illustrated in FIGS. 3A–3D are similar. For example, the width of the solder mask 118 is shown as W1 and the length of each solder mask 118 is shown as L1. The width of the die attach metallization layer 116 is shown as W2 and the length of the die attach metallization layer is shown as L2. These lengths L1, L2 and widths W1, W2 may vary according to the size of the semiconductor die 102 and/or the electrical and thermal requirements of the mounting structure 100. In general, the area of the solder mask 118 (L1×W1) is larger than the area of the die attach metallization layer 116 (L2×W2) regardless of the embodiment of the mounting structure 100.

Figure 3A:
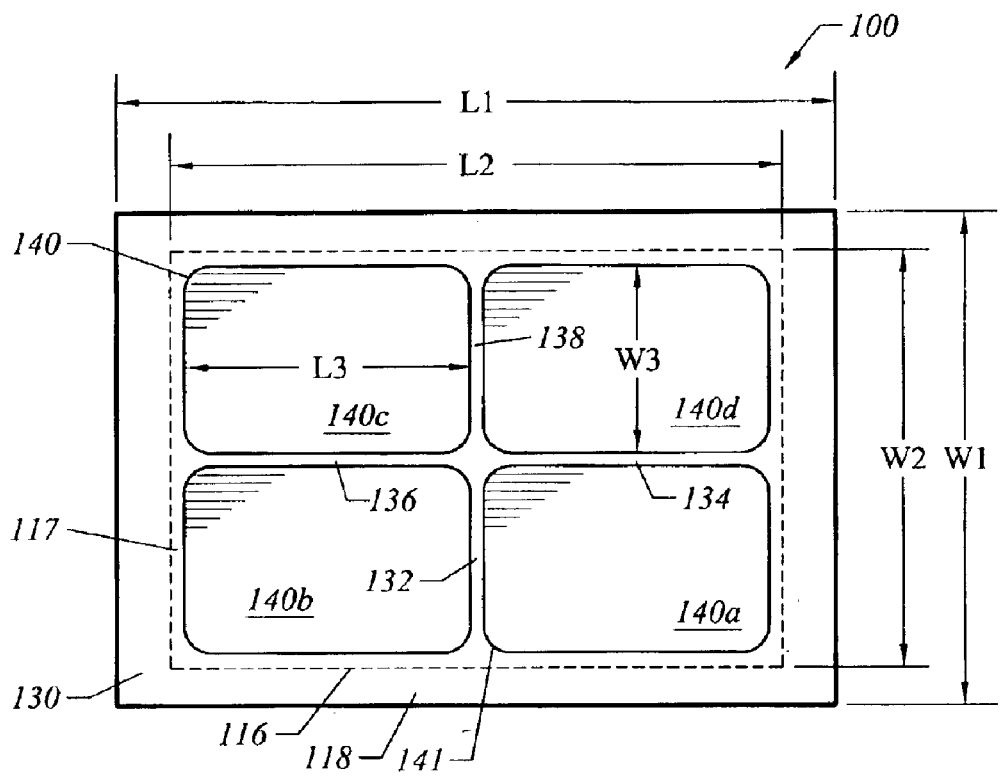
FIGS. 3A–3D are top views of various embodiment of a solder mask according to the present invention.
Figure 3B:
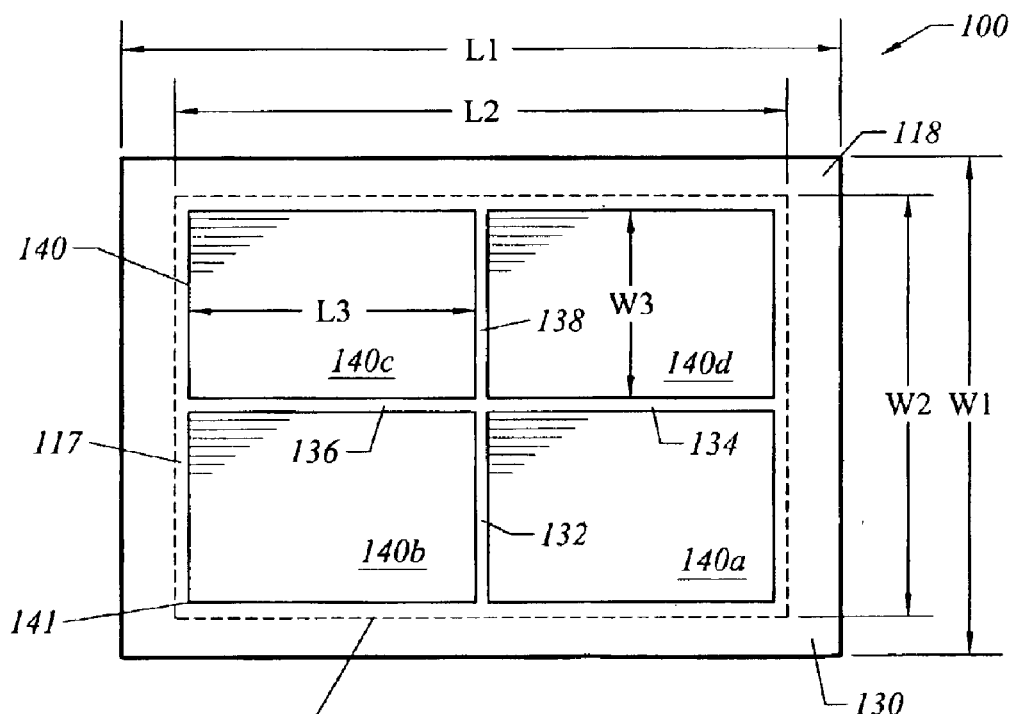
Figure 4:
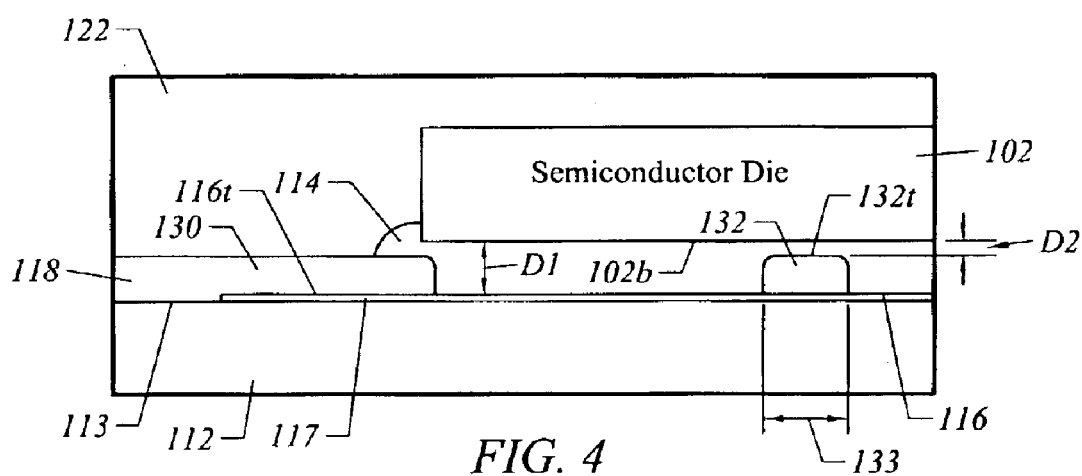
FIG. 4 is a cross-sectional representative view of the first embodiment of the solder mask shown in FIG. 3A.

FIG. 3A illustrates a first embodiment of the mounting structure 100. The solder mask 118 partially covers the die attach metallization layer 116. The solder mask 118 has a peripheral region 130 that overlaps the edges 117 of the die attach metallization layer 116. The peripheral region 130 is connected by four web connectors 132, 134, 136, 138 that each extend towards the middle of the die attach metallization layer 116 and connect together such that the solder mask 118 is a continuous structure. Thus, the solder mask 118 forms a pattern over the die attach metallization layer 116. The peripheral region 130 and the four web connectors 132, 134, 136, 138 create four "windows" or exposed areas 140a, 140b, 140c, 140d of the die attach metallization layer 116. In this embodiment, each exposed area 140a, 140b, 140c, 140d has a substantially rectangular shape having a width W3 and a length L3. The width W3 and the length L3 of each exposed area 140 may vary and do not have to be the same for each exposed area 140. Each exposed area 140a, 140b, 140c, 140d includes a radius minimizing strain gradient in each corner area 141. FIG. 3B illustrates that each rectangular exposed area 140 may also have sharp corners 141.

The peripheral area 130 of the solder mask 118, in combination with the four web connectors 132, 134, 136, 138, preferably covers a small portion of the die attach metallization layer 116. In a preferred embodiment, the solder mask 118 covers less than 10% of the die attach metallization layer 116. Thus, the width of the web connectors 132, 134, 136, 138 that separates each exposed area 140a, 140b, 140c, 140d is minimized and in a preferred embodiment, is less than 0.004 in. The solder mask 118 effectively reduces the total contact area between the semiconductor die 110 and the die attach metallization layer 116.

As previously mentioned above, a large area of contact between the layer of semiconductor die 110 and the die attach metallization layer 116 increases the strain characteristics of the package. Thus, covering a portion of the die attach metallization layer 116 reduces the strain realized by the package. The width of each web connector 132, 134, 136, 138 should be minimized however to keep any increase in both thermal and electrical resistance to a minimum due to the reduced cross-sectional area.

Figure 3C:
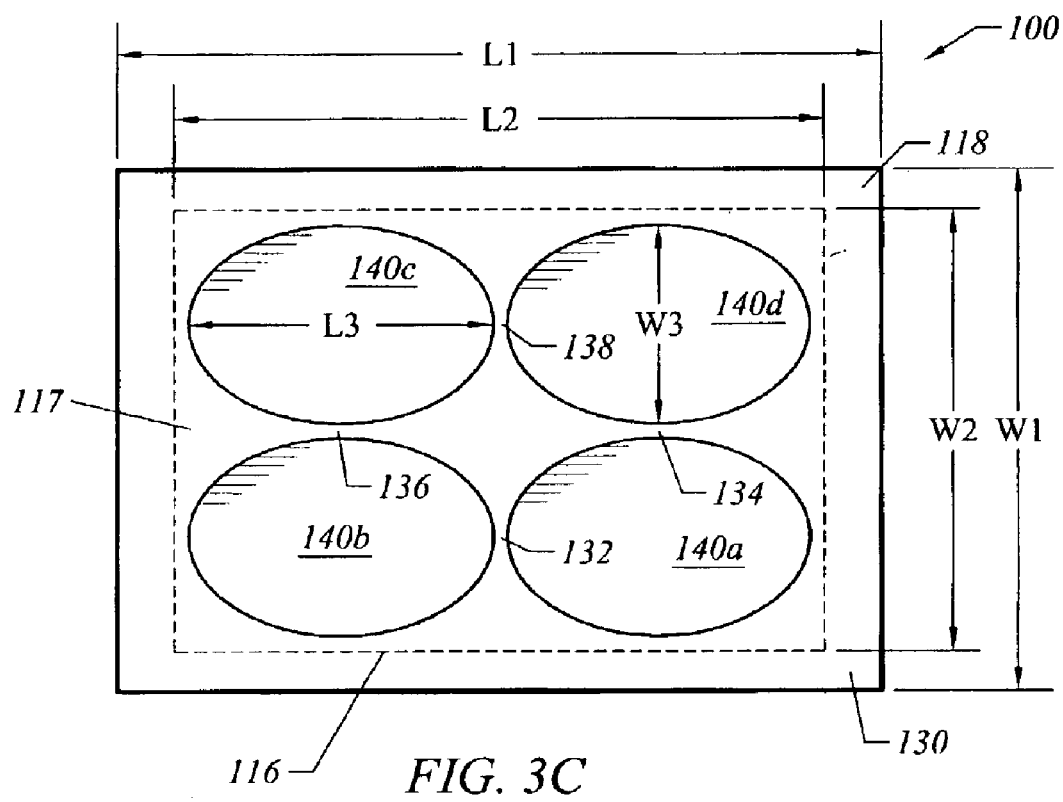

FIG. 3C illustrates a third embodiment of a die attach structure 100. The solder mask 118 partially covers the die attach metallization layer 116. The solder mask 118 has a peripheral region 130 that overlaps the edges 117 of the die attach metallization layer 116. The peripheral region 130 is connected by four web connectors 132, 134, 136, 138 that each extend towards the middle of the die attach metallization layer 116 such that the solder mask 118 is a continuous structure and forms a pattern over the die attach metallization layer 116. The peripheral region 130 and the four web connectors 132, 134, 136, 138 create four "windows" or exposed areas 140 of the die attach metallization layer 116. In this embodiment, each exposed area 140a, 140b, 140c, 140d has a substantially oval shape having a width W3 and a length L3. Each exposed area 140 may have a different height and width from an adjacent exposed area 140. Similar to the embodiment shown in FIG. 3A, the area of each exposed area 140 (W3×L3) is maximized to optimize the amount of exposed are. Maximizing the size of each exposed area 140, in combination with minimizing the width of each web connector, reduces any increase in electrical and thermal resistance of the package.

Figure 3D:
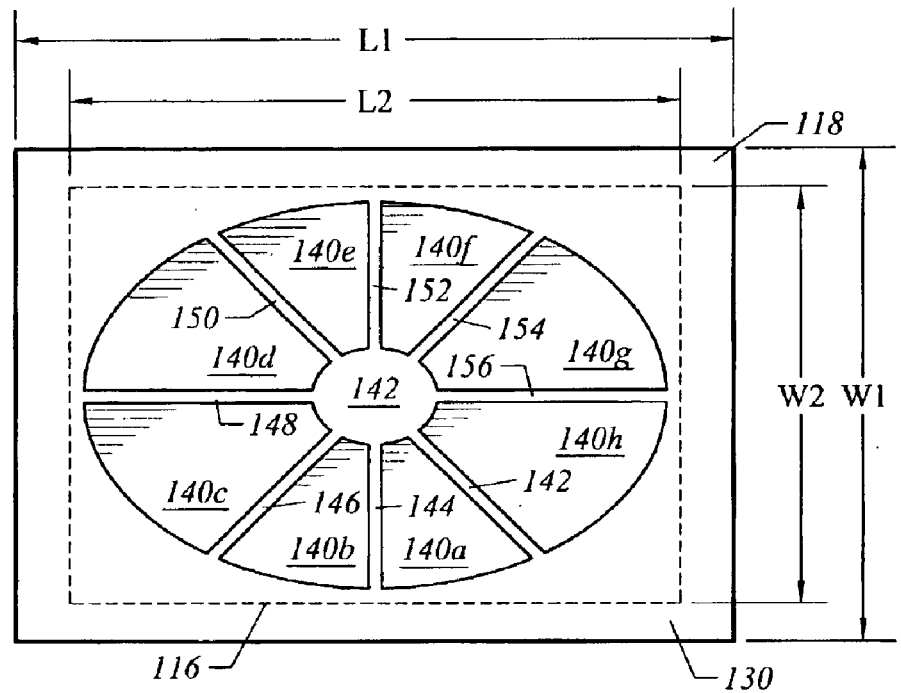

FIG. 3D illustrates a fourth embodiment of a die attach structure 100. The solder mask 118 partially covers the die attach metallization layer 116. The solder mask 118 shown in FIG. 3D forms a wagon-wheel like pattern. The solder mask 118 has a peripheral region 130 that is connected to a center area 142 by eight web connectors 142, 144, 146, 148, 150, 152, 154, 156. The solder mask 118 may include more or less than eight web connectors. The peripheral area 130 and the eight web connectors 142, 144, 146, 148, 150, 152, 154, 156 create eight exposed areas 140a, 140b, 140c, 140d, 140e, 140f, 140g, 140h of the die attach metallization layer 116. As shown in FIG. 3D, each exposed area 140 has a substantially identical shape. It is within the spirit and scope of the invention for each exposed area 140 to have a different shape than an adjacent exposed area 140. Similar to the previous embodiments, the area of each exposed area 140 is maximized and the width of each web connector is minimized.

FIG. 4 illustrates a partial cross-sectional view of a chip package that utilizes the solder mask arrangement shown in FIG. 3A. Mounted on the top surface 113 of the substrate 112 is the die attach metallization layer 116. The die attach metallization layer 116 includes a top surface 116t that faces the bottom surface 102b of the semiconductor die 102. The peripheral region 130 of the solder mask 118 overlaps the edge 117 of the die attach metallization layer 116. The web connector 132 covers a center portion of the die attach metallization layer 116. As mentioned previously, the width 133 of the solder mask support 132 should be minimal to keep any increase in thermal and electrical resistance of the mounting structure 100 to a minimum.

The layer of die attach material 114 covers the pattern created by the solder mask 118. For example, the layer of die attach material 114 covers each web connector 132, 134, 136, 138 and fills in each exposed area 140. The layer of die attach material 114 also overlaps a portion of the peripheral region 130 of the solder mask 118 to eliminate or reduce the possibility that the package mold material 122 will directly contact the die attach metallization layer 116. In a preferred embodiment, the bottom surface 102b of the semiconductor die 102 does not directly contact the web connectors 132, 134, 136, 138 or the peripheral region 130 of the solder mask 118. Thus, the thickness of the die attach material 114 is preferably greater than the height of the solder mask 118. As shown in FIG. 4, the layer of die attach material 114 has two different depths—a first depth D1 and a second depth D2. The first depth D1 is defined by the distance between the bottom surface 102b of the semiconductor die 102 and the top surface 117 of the die attach metallization layer 116. The second depth D2 is defined by the distance between the bottom surface 102b of the semiconductor die 102 and the top surface 133 of the web connector 132. The depth D2 is preferably substantially uniform for each web connector. The depth D1 is greater than the depth D2. Since the web connector 132 preferably does not contact the bottom surface 102b of the semiconductor die 102, the depth D1 is preferably no less than the height of the web connector 132.

As previously mentioned above, efficient heat transfer requires a thin layer of die attach material 114 while a minimal die attach strain requires a thicker layer of die attach material 114. As shown in FIG. 4, the thin layer of die attach material 114 (e.g., depth D2) provides optimal thermal properties but high strain properties. The thicker layer of die attach material 114 (e.g., depth D1) provides better strain properties but lower thermal properties. Thus, the two different depths D1, D2 of die attach material 114 creates an optimal layer of die attach material 114 with regard to the strain and thermal properties of the package.

The shapes of the exposed areas 140 shown in FIGS. 3A–3D are only intended as examples. Other patterns and/or shapes may be formed into the solder mask 118. In a preferred embodiment, the rectangular exposed areas 140 with or without corner radii (e.g., FIGS. 3A–3B) expose the largest area of the die attach metallization layer 116 and result in a minimum increase in thermal and electrical resistance of the package 100.

Figure 5:
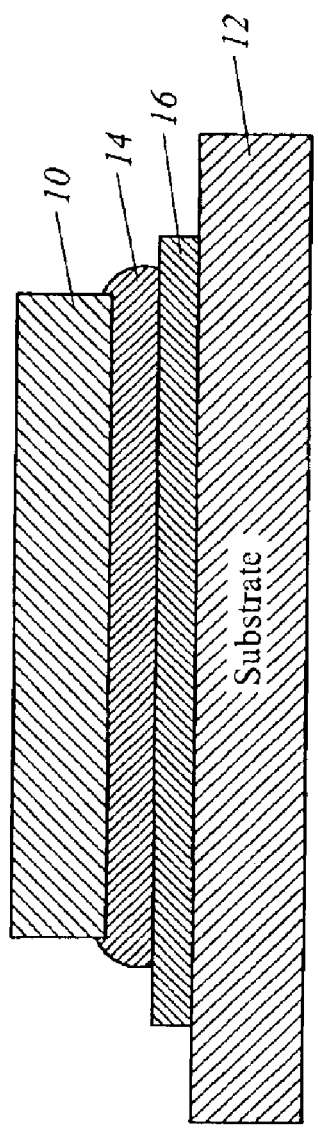
FIG. 5 is a cross-sectional representative view of a semiconductor die attached to a substrate, according to the prior art.

A conventional chip package, as shown in FIG. 5, illustrates a semiconductor die 10 mounted to a single die attach pad 16. The die attach pad 16 is mounted on the top surface of a substrate 12. The layer of die attach material 14 partially covers the die attach pad 16. The semiconductor die 10 is secured to the layer of die attach material 14. This conventional technique produces a thick layer of die attach material 14, which provides unwanted high electrical and thermal resistance characteristics. It would be advantageous to achieve a thinner layer of die attach material 14 to improve the electrical and thermal characteristics of the package while not greatly increasing the die attach strain properties.

Figure 7:
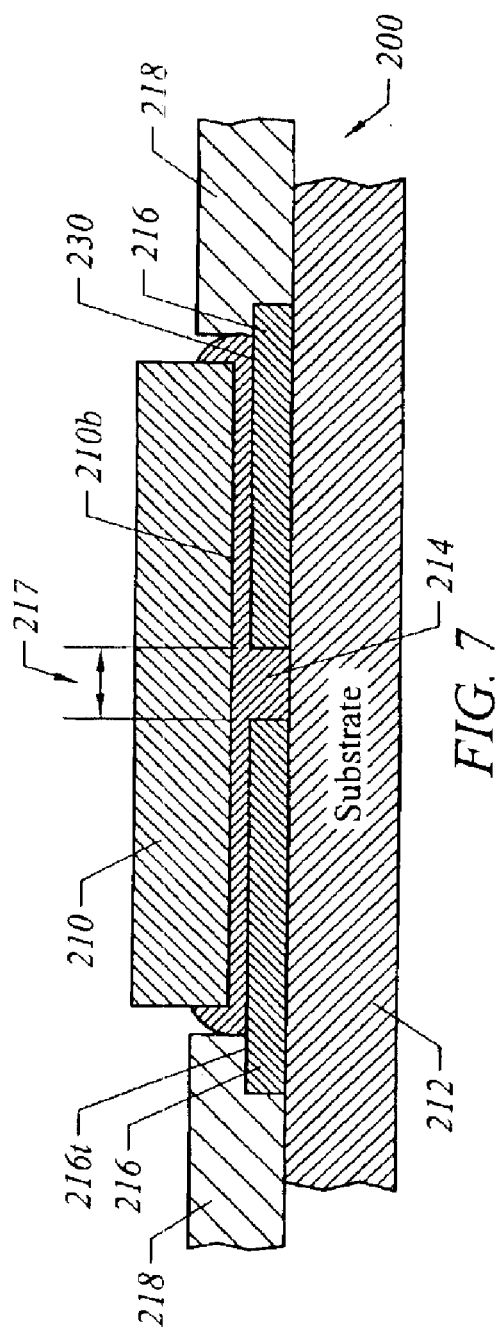
FIG. 7 is a cross-sectional representative view of the die mounting structure shown in FIG. 6A.

FIGS. 6–7 illustrate a second technique for reducing die attach bond line thickness to improve the electrical and thermal resistance characteristics of the package. In general, this second technique "breaks up" or divides the die attach metallization layer into several die attach pads 216 that are electrically coupled together on the substrate.

Figure 6A:
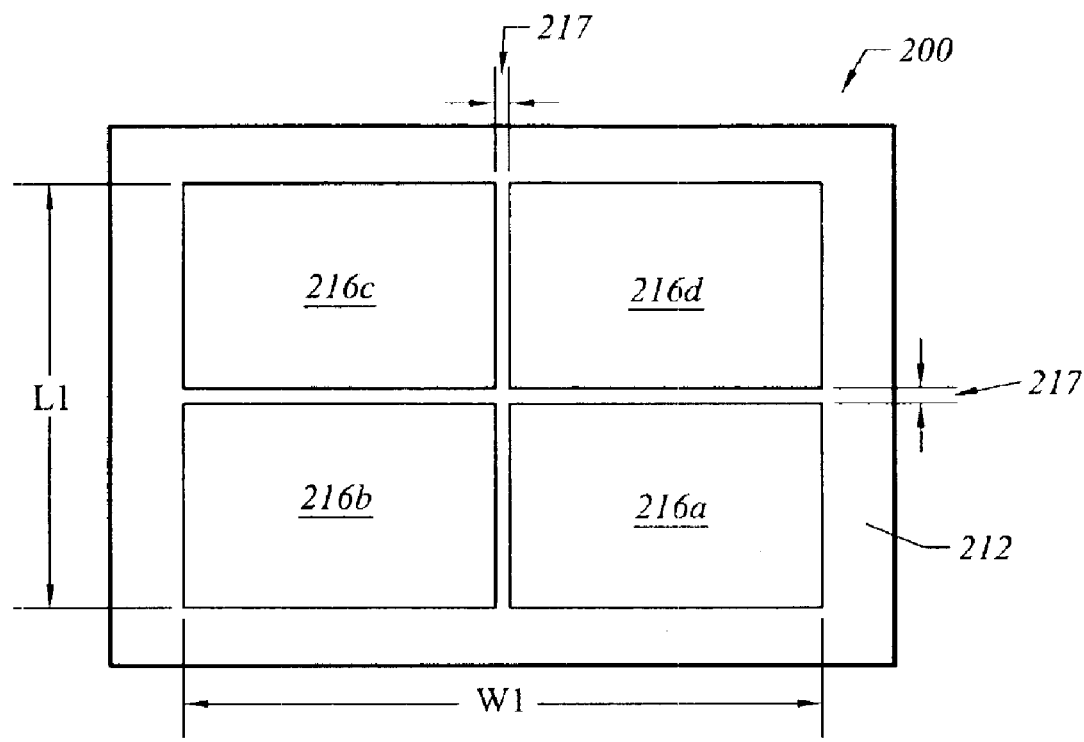
FIGS. 6A–6E are top views of various embodiments of a die mounting structure according to the present invention.

The die attach pads 216 may comprise many different shapes. FIG. 6A illustrates a first embodiment of the die mounting structure 200. In this embodiment, four substantially rectangular die attach pads 216a, 216b, 216c, 216d are mounted on the substrate 212. Each die attach pad 216 is preferably separated from an adjacent die attach pad 216 by a space 217. As will be described in more detail later, a layer of die attach material 214 is deposited over a portion of each die attach pad 216. The die attach material 214 fills in each space 217 located between each die attach pad 216. These spaces 217 do not efficiently transfer heat to a die attach pad 216. Thus, the spaces 217 are minimized to ensure that a maximum amount of the die attach material 214 directly contacts the top surface of each die attach pad 216.

Figure 6B:
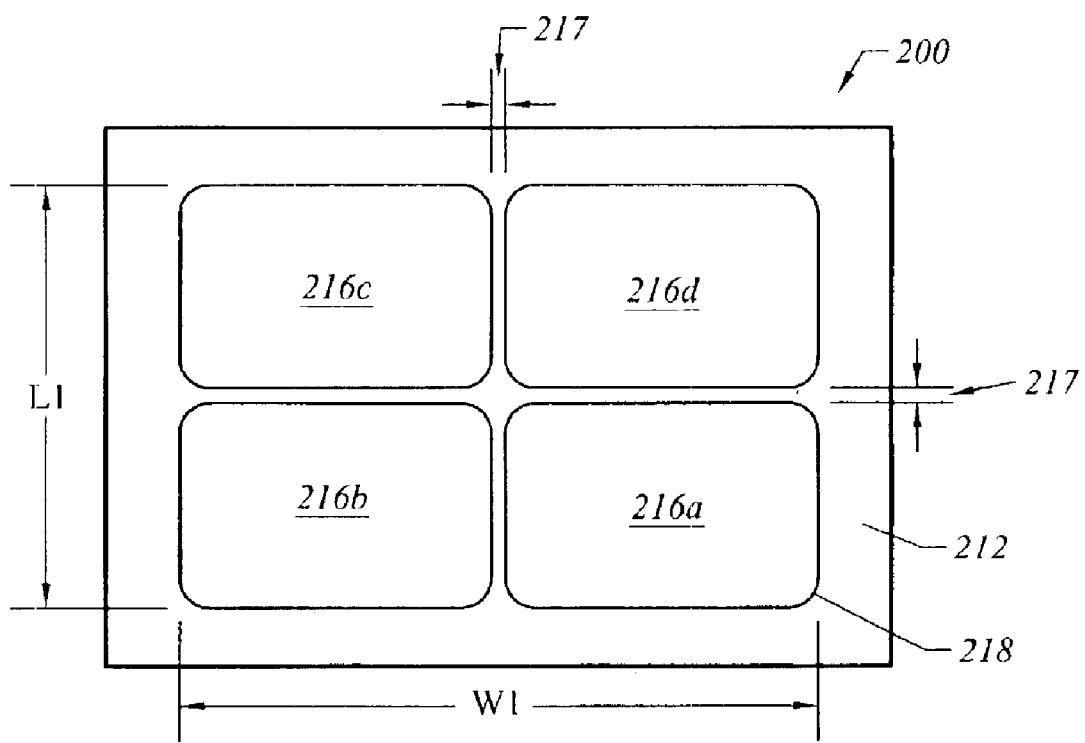

The four die pads 216 are preferably electrically coupled together by wire bonds or copper traces (not shown). It is within the scope and spirit of the invention to have a portion of each of the die attach pads 216 to contact each other. The four die attach pads 216, for practical purposes, create a single die attach pad having a width W1 and a length L1 that a semiconductor die may secure to with a layer of die attach material. FIG. 6B illustrates that each rectangular die attach pad 216 may also include rounded corners 218.

Figure 6C:
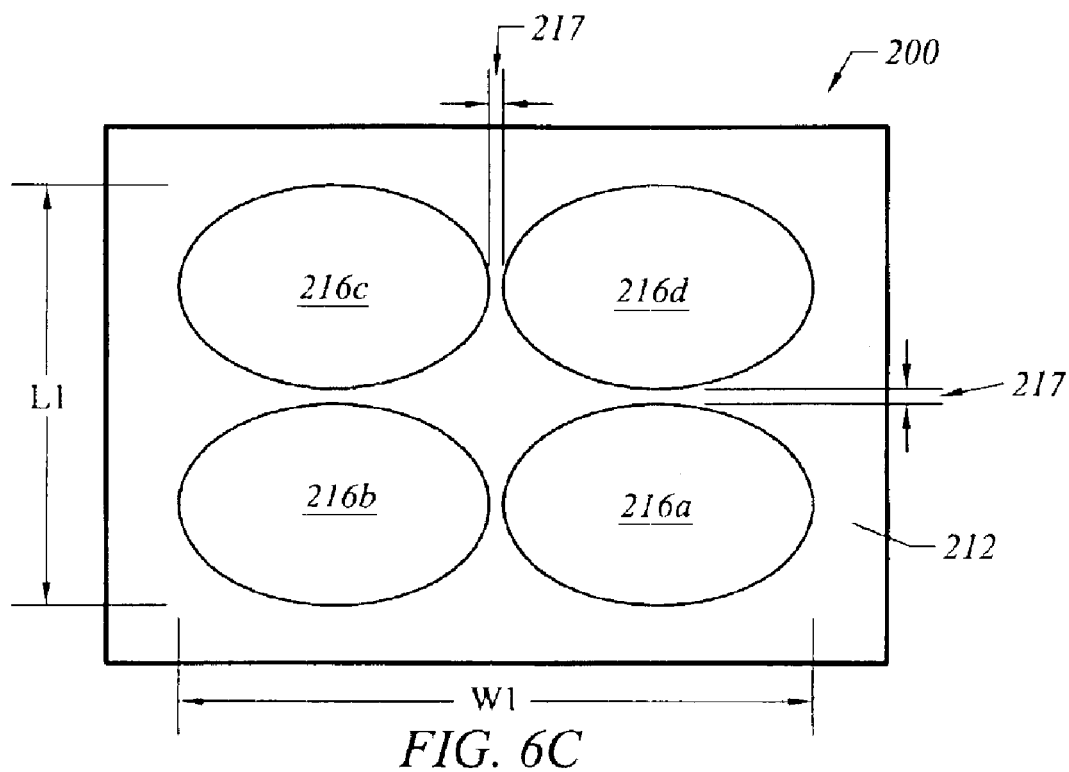

FIG. 6C illustrates that the mounting structure 200 may also comprise oval shaped die attach pads 216. Each oval shaped die attach pad 216 is positioned close together to minimize the size of the spaces 217 located between each die attach pad 216. Similar to the rectangular die attach pads 216 shown in FIG. 6A, the oval die attach pads 216, for practical purposes, creates a single die attach pad having a width W1 and a length L1.

Figure 6D:
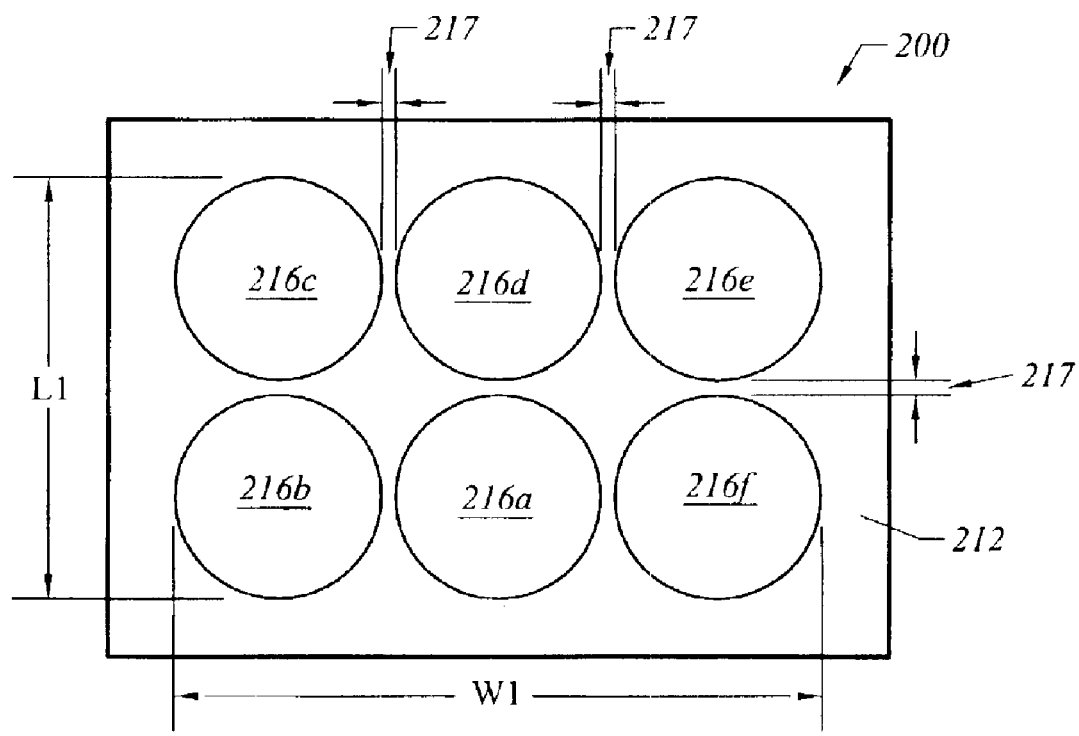

FIG. 6D illustrates that the mounting structure 200 may also comprise circular die attach pad 216. Each circular die attach pad 216a, 216b, 216c, 216d, 216e, 216f is separated from an adjacent die attach pad 216 by a space 217. Similar to the previous embodiments, each die attach pad 216 is positioned close together to minimize the size of each space 217 located between adjacent die attach pads 216. Even though six identical die attach pads 216 are shown in FIG. 6D, it is within the scope and spirit of the invention to have more or less than six circular die attach pads 216. Additionally, each die attach pad 216 does not have to be identical in shape.

Figure 6E:
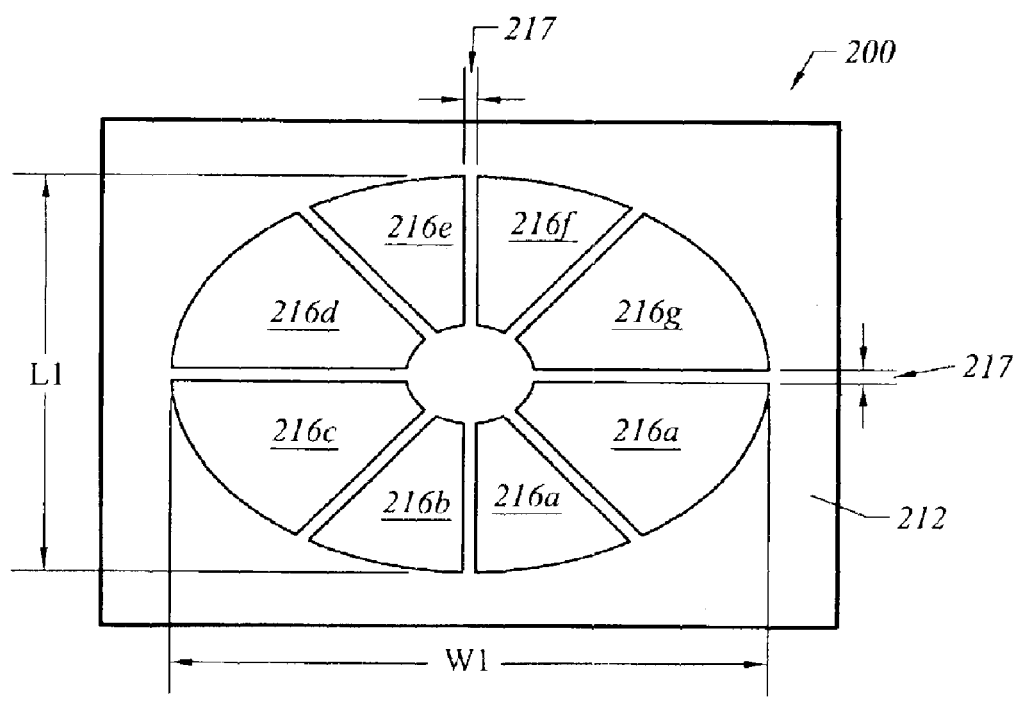

FIG. 6E illustrates that the mounting structure 200 may also comprise a wagon-wheel like shape die attach pad 216. In this embodiment, the mounting structure 200 includes eight die attach pads 216a, 216b, 216c, 216d, 216e, 216f, 216g, 216h. Each die attach pad 216 is preferably separated from an adjacent die attach pad 216 by a space 217. The configuration of the die attach pads 216 create a center space 242. Each space 217 and the center space 242 expose the top surface of the substrate 212. In a preferred embodiment, each die attach pad 216 is electrically coupled together to improve the electrical properties of the package. As shown in FIG. 6E, each die attach pad 216 has a substantially identical shape. Each die attach pad 216 may also have a different shape.

FIG. 7 illustrates a package that incorporates the mounting structure 200 shown in FIG. 6A. The rectangular shaped die attach pads 216 are mounted on the top surface of the substrate 212 and are separated from each other by a space 217. It is within the scope and spirit of the invention for a portion of each die attach pad 216 to contact each other. As shown in FIG. 7, the solder mask 218 creates an opening that is larger than the semiconductor die 210. The die attach material 214 is deposited into the solder mask opening and covers a portion of the top surface 216t of each die attach pad 216. The die attach material 214 also fills in the space 217 located between the die attach pads 216 and contacts the substrate 212. In one embodiment, the layer of die attach material 214 leaves a peripheral region 230 of each die attach pad 216 exposed so that the solder mask 118 may overlap. The layer of die attach material 214 may also completely cover the top surface 216t of each die attach pad 216.

The semiconductor die 210 is pressed into the layer of die attach material 214. A thin layer of die attach material 214 is created beneath the bottom surface 210b of the semiconductor die 210 and the top surface 216t of each die attach pad 216. A thicker layer of die attach material 214 is created within each space 217 as the die attach material 214 must fill in the area between the bottom surface 102b of the semiconductor die 102 and the top surface of the substrate 102.

The layer of die attach material 214 is preferably an electrically and thermally conducting material. As shown in FIG. 7, the layer of die attach material 214 contacts at least a portion of each die attach pad 216. Thus, the layer of die attach material 214 electrically and thermally bridges the die attach pads 216. As previously mentioned, for practical purposes, the die attach pads 216 function as a single die attach pad having a width W1 and a length L1.

A thin layer of die attach material 214 is desirable to improve the electrical and thermal properties of the package. The layer of die attach material 214 can only be minimized so much. Eventually, the layer of die attach material 214 located between the semiconductor die 210 and the die attach pad 216 will become so thin that the attachment between the two surfaces will result in high product failure. This adhesive and/or cohesive failure is a result of the coefficient of thermal expansion (CTE) mismatch between the semiconductor die 212 and the layer of die attach material 214. The minimum thickness of the layer of die attach material 214 is proportional to the area of attachment between the bottom surface 210b of the semiconductor die 210 and the layer of die attach material 214. The stress reduction features in the die attach pad 216 of the package permit the use of a thinner minimum reliable layer of die attach material 214 resulting in superior thermal performance and reliability. The technique illustrated in FIGS. 6–7 is equally beneficial with a wide variety of chip types and die attach media such as epoxies, thermoset plastics, cyanoesters, Bismaleimide Resin, and soft solders.

As shown in FIG. 7, the layer of die attach material 214 extends out beyond the edges of the semiconductor die 212. The solder mask 218 overlaps a portion of the die attach pads 216 and contacts the layer of die attach material 214. This embodiment eliminates or reduces the possibility for the package mold material to contact the layer of die attach material 214.

The foregoing description of preferred embodiments of the present invention has been provided for the purposes of illustration and description. It is not intended to be exhaustive or to limit the invention to precise forms disclosed. Obviously, many modifications and variations will be apparent to practitioners skilled in the art. The embodiments were chosen and described in order to best explain the principles of the invention and its practical application, thereby enabling others skilled in the art to understand the invention for various embodiment and with various modifications as are suited to the particular use contemplated. It is intended that the scope of the invention be defined by the following claims and their equivalents.

We claim:

1. A mounting structure for a semiconductor die having a first and second surface, the mounting structure comprising:
    a die attach metallization layer having a top surface facing said second surface of said semiconductor die;
    a mask, said mask forming a pattern over said top surface of said die attach metallization layer, said pattern including a web that covers a portion of said top surface of said die attach metallization layer and creates a plurality of exposed areas of said top surface of said die attach metallization layer, at least a portion of each one of said plurality of exposed areas is separated by said web and is located under said second surface of said semiconductor die when said semiconductor die is secured to the mounting structure; and a layer of die attach material, said layer of die attach material covering said pattern and filling in each one of said plurality of exposed areas.

2. The mounting structure according to claim 1, wherein said mask comprises a solder mask.

3. The mounting structure according to claim 1, wherein each one of said plurality of exposed areas is substantially rectangular.

4. The mounting structure according to claim 1, wherein each one of said plurality of exposed areas is substantially oval.

5. The mounting structure according to claim 1, wherein each one of said plurality of exposed areas is substantially elliptical.

6. The mounting structure according to claim 1, wherein less than 10% of said top surface of said die attach metallization layer is covered by said solder mask.

7. The mounting structure according to claim 1, wherein the thickness of said web separating each one of said plurality of exposed areas is less than 0.004 inches.

8. The mounting structure according to claim 1, wherein the second surface of the semiconductor die has a predetermined area.

9. The mounting structure according to claim 8, wherein the area of each one of said plurality of exposed areas is less than the predetermined area of the second surface.

10. The mounting structure according to claim 1, wherein the second surface of the semiconductor die contacts said layer of die attach material.

11. A mounting structure, comprising:
a semiconductor die having a first surface and a second surface; and
a die attach pad, including:
a die attach metallization layer having a top surface facing said second surface of said semiconductor die;
a mask, said mask forming a pattern over said top surface of said die attach metallization layer, said pattern including a web that covers a portion of said top surface of said die attach metallization layer and creates a plurality of exposed areas of said top surface of said die attach metallization layer, at least a portion of each one of said plurality of exposed areas is separated by said web and is located under said second surface of said semiconductor die; and
a layer of die attach material, said layer of die attach material covering said pattern and filling in each one of said plurality of exposed areas.

12. The mounting structure according to claim 11, wherein said mask comprises a solder mask.

13. The mounting structure according to claim 11, wherein each one said plurality of exposed areas is located under said second surface when said semiconductor die is secured to said die attach pad.

14. The mounting structure according to claim 11, wherein each one of said plurality of exposed areas is substantially rectangular.

15. The mounting structure according to claim 11, wherein each one of said plurality of exposed areas is substantially oval.

16. The mounting structure according to claim 11, wherein each one of said plurality of exposed areas is substantially elliptical.

17. The mounting structure according to claim 11, wherein said web covers less than 10% of said top surface of said die attach metallization layer.

18. The mounting structure according to claim 11, wherein the thickness of said web separating each one of said plurality of exposed areas is less than 0.004 inches.

19. The mounting structure according to claim 11, wherein the second surface of the semiconductor die has a predetermined area.

20. The mounting structure according to claim 19, wherein the area of each one of said plurality of exposed areas is less than the predetermined area of the second surface.

21. The mounting surface according to claim 11, wherein said second surface of said semiconductor die contacts said layer of die attach material.

22. A mounting structure for a chip package, comprising:
a semiconductor die having a first surface and a second surface; and
a substrate having a top surface facing said second surface; and
a die mount, including:
a plurality of die attach pads, each one of said plurality of die attach pads being electrically coupled together and mounted to said top surface of said substrate, said plurality of die attach pads having a space between at least a portion of each one of said plurality of die attach pads, each one of said plurality of die attach pads having a top surface facing said second surface of said semiconductor die;
a layer of die attach material covering a substantial portion of said top surface of each one of said plurality of die attach pads and filling in said spaces between each one of said plurality of die attach pads, said layer of die attach material being in contact with said second surface of said semiconductor die.

23. A mounting structure for a chip package, comprising:
a semiconductor die having a first surface and a second surface; and
a substrate having a top surface facing said second surface; and
a die mount, including:
a plurality of die attach pads, each one of said plurality of die attach pads being electrically coupled together and mounted to said top surface of said substrate, said plurality of die attach pads having a space between at least a portion of each one of said plurality of die attach pads, each one of said plurality of die attach pads having a top surface facing said second surface of said semiconductor die;
layer of die attach material covering a substantial portion of said top surface of each one of said plurality of die attach pads and filling in said spaces between each one of said plurality of die attach pads, said layer of die attach material being in contact with said second surface of said semiconductor die; and
a mask having an opening that is larger than said second surface of said semiconductor die.

24. The mounting structure according to claim 23, wherein said mask comprises a solder mask.

25. The mounting structure according to claim 23, wherein said mask contacts said layer of die attach material and a portion of said top surface of each one of said plurality of die attach pads.

26. The mounting structure according to claim 22, wherein each one of said plurality of said die attach pads is substantially rectangular.

27. The mounting structure according to claim 22, wherein each one of said plurality of said die attach pads is substantially elliptical.

28. The mounting structure according to claim 22, wherein each one of said plurality of said die attach pads is substantially oval.

29. The mounting structure according to claim 22, wherein said layer of die attach material is electrically conductive.

30. The mounting structure according to claim 22, wherein each one of said plurality of die attach pads is comprised of copper.

31. A mounting structure for a chip package that includes a semiconductor die, the semiconductor die having a first surface and a second surface, the mounting structure comprising:

a substrate;

a plurality of die attach pads, each one of said plurality of die attach pads being electrically coupled together and mounted to said substrate, said plurality of die attach pads having a space between at least a portion of each one of said plurality of die attach pads, each one of said plurality of die attach pads having a top surface facing the second surface of the semiconductor die; and a layer of die attach material covering a substantial portion of said top surface of each one of said plurality of die attach pads and filling in said spaces, said layer of die attach material being in contact with the second surface of the semiconductor die.

32. A mounting structure for a chip package that includes a semiconductor die, the semiconductor die having a first surface and a second surface, the mounting structure comprising:

a substrate;

a plurality of die attach pads, each one of said plurality of die attach pads being electrically coupled together and mounted to said substrate, said plurality of die attach pads having a space between at least a portion of each one of said plurality of die attach pads, each one of said plurality of die attach pads having a top surface facing the second surface of the semiconductor die;

a layer of die attach material covering a substantial portion of said top surface of each one of said plurality of die attach pads and filling in said spaces, said layer of die attach material being in contact with the second surface of the semiconductor die; and a mask having an opening, said opening being larger than the second surface of the semiconductor die.

33. The mounting structure according to claim 32, wherein said mask comprises a solder mask.

34. The mounting structure according to claim 32, wherein said mask contacts said layer of die attach material and covers a portion of said top surface of each one of said plurality of die attach pads.

35. The mounting structure according to claim 31, wherein each one of said plurality of said die attach pads is substantially rectangular.

36. The mounting structure according to claim 31, wherein each one of said plurality of said die attach pads is substantially elliptical.

37. The mounting structure according to claim 31, wherein each one of said plurality of said die attach pads is substantially oval.

38. The mounting structure according to claim 31, wherein said layer of die attach material is electrically conductive.

39. The mounting structure according to claim 31, wherein each one of said plurality of die attach pads is comprised of copper.

* * * * *